US012592696B2

(12) United States Patent
Bolotnikov

(10) Patent No.: US 12,592,696 B2
(45) Date of Patent: Mar. 31, 2026

(54) CASCODE SEMICONDUCTOR DEVICE

(71) Applicant: SEMICONDUCTOR COMPONENTS INDUSTRIES, LLC, Scottsdale, AZ (US)

(72) Inventor: Alexander Viktorovich Bolotnikov, Niskayuna, NY (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 25 days.

(21) Appl. No.: 18/598,153

(22) Filed: Mar. 7, 2024

(65) Prior Publication Data

US 2025/0286552 A1     Sep. 11, 2025

(51) Int. Cl.
*H03K 17/687*     (2006.01)
*H10D 84/80*      (2025.01)

(52) U.S. Cl.
CPC ......... *H03K 17/687* (2013.01); *H10D 84/811* (2025.01)

(58) Field of Classification Search
CPC ........................... H03K 17/687; H10D 84/811
See application file for complete search history.

(56) References Cited

U.S. PATENT DOCUMENTS 6,822,842 B2     11/2004  Friedrichs et al.
12,072,368 B2 *   8/2024  Majima ................. H03K 17/687

2002/0153938 A1 * 10/2002  Baudelot .............. H03K 17/168
                                        257/E27.069
2014/0284662 A1   9/2014  Ikeda
2015/0043116 A1   2/2015  Weyers et al.
2021/0210484 A1 * 7/2021  Kono ................... H10D 30/831

FOREIGN PATENT DOCUMENTS

EP      3444949  A1   2/2019
EP      2913925  B1   3/2021
JP    2020145576  A   9/2020

OTHER PUBLICATIONS

Biela, Juergen, et al., "Balancing Circuit for a 5-KV/50-NS Pulsed-Power Switch Basedon SIC-JFET Super Cascode", IEEE Transactions on Plasma Science, vol. 40, No. 10, Oct. 2012, pp. 2554-2560.
International Search Report and Written Opinion for PCT Application No. PCT/US2025/017922, mailed on May 14, 2025, 16 pages.

* cited by examiner

*Primary Examiner* — Lincoln D Donovan
*Assistant Examiner* — Amit R Bhatia
(74) *Attorney, Agent, or Firm* — Brake Hughes Bellermann LLP

(57)     ABSTRACT

A semiconductor power device may include a first power transistor configured to generate an output voltage. A semiconductor power device may include a second power transistor configured to receive an input voltage. The second power transistor is connected to the first power transistor in a cascode configuration. A semiconductor power device may include a voltage divider circuit connected to a gate terminal of the first power transistor and a source terminal of the second power transistor.

16 Claims, 9 Drawing Sheets

200

200

500

CASCODE SEMICONDUCTOR DEVICE

BACKGROUND

The on-resistance of a typical unipolar semiconductor power device may scale proportionally to the square of the rated voltage of the semiconductor power device. The on-resistance may be a measure of the resistance of the transistor when the transistor is conducting current, while the breakdown voltage is a limit (e.g., a maximum voltage) that the transistor can withstand without malfunctioning (e.g., thermal runaway or destruction). In general, there is a direct relationship between the breakdown voltage and the on-resistance (e.g., as the breakdown voltage of the transistor increases, on-resistance of a transistor may increase).

SUMMARY

In some aspects, the techniques described herein relate to a semiconductor power device including: a first power transistor configured to generate an output voltage; a second power transistor configured to receive an input voltage, the second power transistor connected to the first power transistor in a cascode configuration; and a voltage divider circuit connected to a gate terminal of the first power transistor and a source terminal of the second power transistor.

In some aspects, the techniques described herein relate to a semiconductor power device including: a first power transistor configured to generate an output voltage; a second power transistor configured to receive an input voltage, the second power transistor connected to the first power transistor in a cascode configuration; and a voltage divider circuit configured to indirectly couple a gate terminal of the first power transistor to a source terminal of the second power transistor, the voltage divider circuit including at least one first circuit element and at least one second circuit element.

In some aspects, the techniques described herein relate to a method including: activating a first power transistor of a semiconductor power device and a second power transistor of the semiconductor power device in response to a gate-source voltage of the semiconductor power device being equal to or greater than a threshold voltage of the second power transistor; deactivating the second power transistor in response to the gate-source voltage of the semiconductor power device being less than the threshold voltage of the second power transistor; and reducing, by a voltage divider circuit, a potential of a gate-source voltage of the first power transistor to be less than a gate-source maximum voltage rating, the voltage divider circuit indirectly connecting a gate of the first power transistor to a source terminal of the second power transistor.

The details of one or more implementations are set forth in the accompanying drawings and the description below. Other features will be apparent from the description and drawings, and from the claims.

DETAILED DESCRIPTION

Figure 1A:
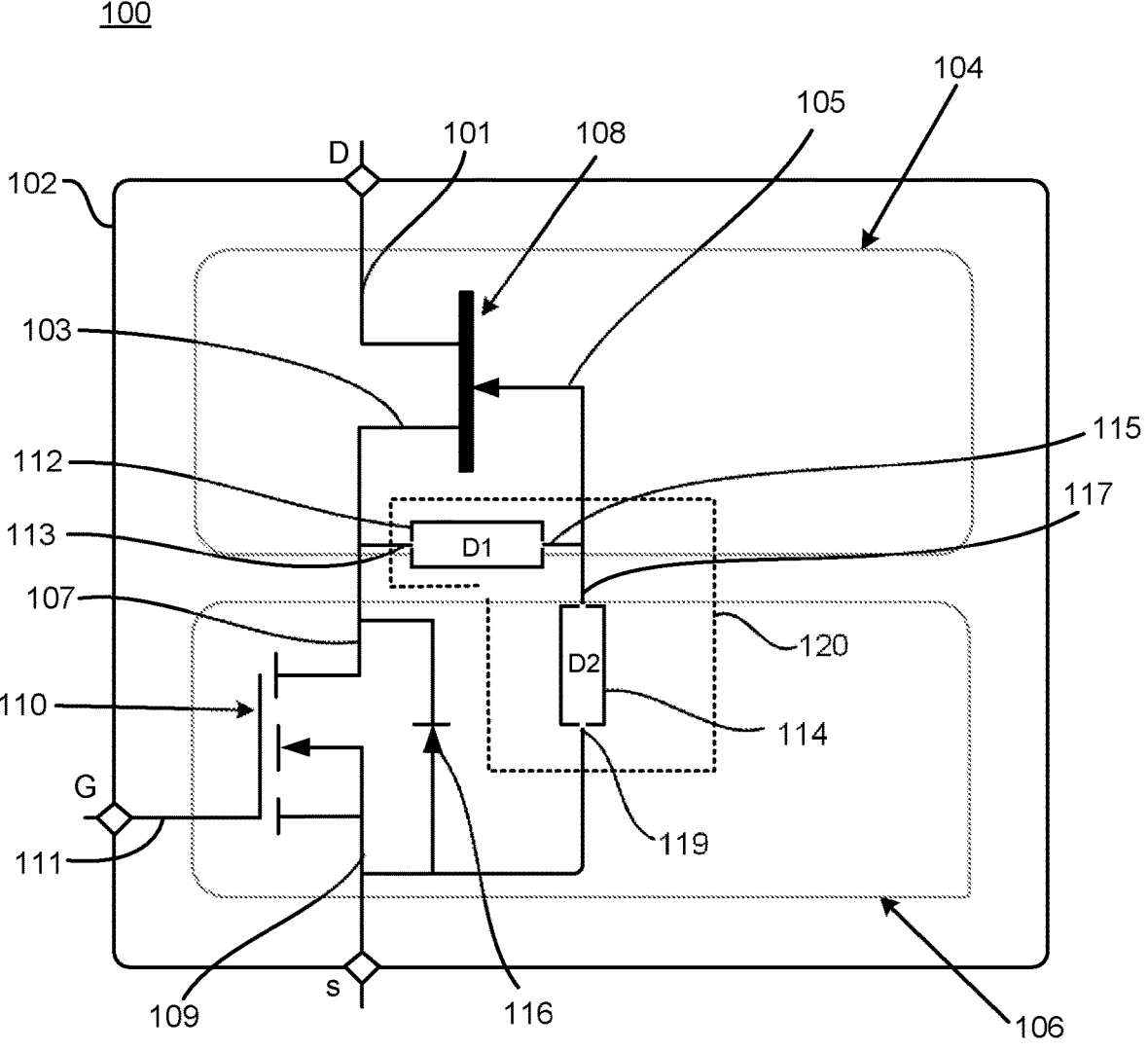
FIG. 1A illustrates a semiconductor power device with a voltage divider and first and second power transistors connected in a cascode configuration according to an aspect.

The present disclosure relates to a semiconductor power device with a first power transistor (e.g., an upper transistor) and a second power transistor (e.g., a lower transistor), where a terminal (e.g., a gate) of the first power transistor is coupled (e.g., indirectly coupled) to a terminal (e.g., a source) of the second power transistor via a voltage divider. The semiconductor power device discussed herein may have low on-resistance while providing a relatively high breakdown voltage (e.g., improving the tradeoff between on-resistance and breakdown voltage), thereby providing a more efficient, compact, and/or reliable power electronics system. In some examples, the semiconductor power device discussed herein may provide shorter termination lengths, smaller active area and thinner epitaxial layers, which can contribute to higher yield and/or lower manufacturing cost.

The first power transistor and the second power transistor are connected to each other in a cascode configuration (e.g., the drain terminal of the second power transistor is connected to the source of the first power transistor, while the gate of the first transistor is coupled to the source of the second transistor). The voltage divider includes at least one first circuit element (e.g., one or more first circuit elements) and at least one second circuit element (e.g., one or more second circuit element). In some examples, the first circuit element is a voltage clamping element. In some examples, the first circuit element includes one or more diodes. In some examples, the second circuit element is a capacitor. In some examples, the second circuit element includes a capacitor and a resistor. According to the techniques discussed herein, the gate-source voltage ($V_{gs\_upper}$) of the first power transistor may be less (e.g., always less) than a maximum allowed gate-source voltage ($V_{gs\_upper\_max}$). In some examples, the second power transistor may be a high voltage device. As a result, the drain-source voltage ($V_{ds\_lower}$) of the second power transistor may substantially exceed the gate-source voltage ($V_{gs\_upper}$) of the first power transistor. In some examples, the voltage rating of the semiconductor power device is the sum of the voltage ratings of the first and second power transistors.

In some conventional approaches, the lower device of the cascode may be a low voltage transistor, which may allow the gate of an upper device to be directly connected to the source of a lower device (e.g., Vds_lower is always <Vgs_max_upper). In contrast to some conventional approaches, the semiconductor power device discussed herein may include a high voltage lower transistor, thus Vds_lower may be higher (e.g., substantially higher) than Vgs_max_upper. In some examples, the gate of the upper transistor directly connected to the source of the lower device may lead to the upper transistor damage and/or whole device damage. However, as discussed herein, the gate of the first power transistor is coupled (e.g. indirectly connected) to the source of the second power transistor using a voltage divider, where one of the elements of the voltage divider includes a voltage clamping element, which can reduce Vgs applied to the upper transistor to be less than a Vgs_max upper (e.g., a gate-source voltage maximum rating), while still enabling a cascode operation.

In some examples, the first power transistor includes a junction field-effect transistor (JFET), a metal-oxide-semiconductor field-effect transistor (MOSFET), or a bipolar junction transistor (BJT). In some examples, the first power transistor includes high-voltage silicon carbide JFET. In some examples, the first power transistor is configured as a normally-on device. A normally-on device is a transistor that conducts current when the gate-to-source voltage is zero or substantially zero. The first power transistor's gate-to-source voltage can be used to control the amount of current that the device conducts. In some examples, the second power transistor includes MOSFET, a JFET, or a BJT. In some examples, the second power transistor includes a high-voltage silicon carbide MOSFET. In some examples, the second power transistor is configured as a normally-off device. A normally-off device is a transistor that does not conduct current when the gate-to-source voltage is zero or substantially zero. In some examples, the first power transistor is a normally-off device and the second power transistor is a normally-on device.

Figure 1B:
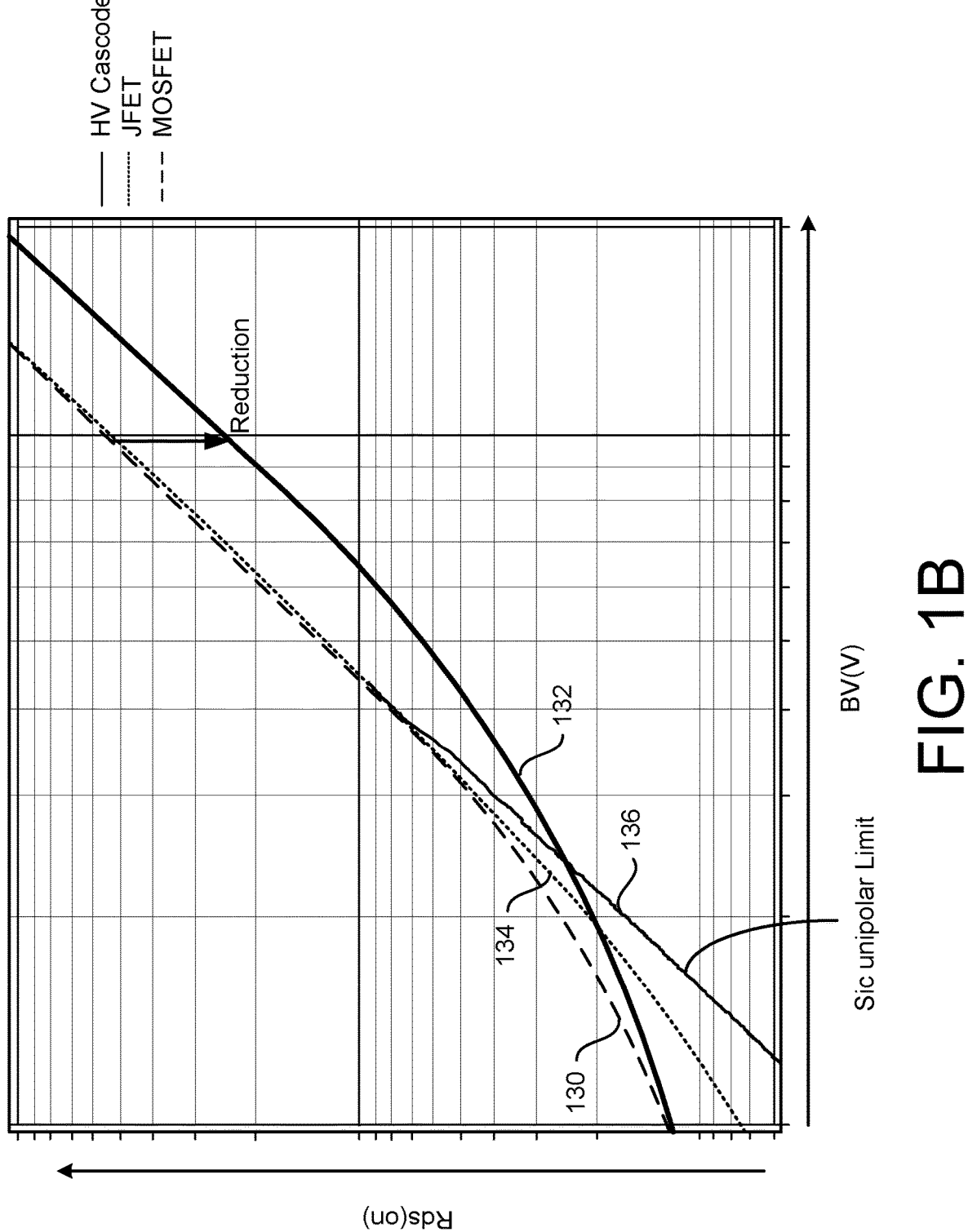
FIG. 1B illustrates a graph depicting a reduction in specific on-resistance for a high voltage semiconductor power device according to an aspect.

FIGS. 1A to 1B illustrate a semiconductor power device 100 according to an aspect. The semiconductor power device 100 includes a first power transistor 108 and a second power transistor 110. The second power transistor 110 is configured to receive an input voltage. The first power transistor 108 is configured to generate an output voltage. The first power transistor 108 and the second power transistor 110 are connected in a cascode configuration. A cascode configuration may be a two stage amplifier circuitry in which two or more semiconductor power devices (e.g., the first power transistor 108 and the second power transistor 110) are connected in series to achieve higher input-output isolation, higher input impedance, high output impedance, and/or higher bandwidth. The semiconductor power device 100 discussed herein may also allow a higher voltage and/or current rating. In some examples, the semiconductor power device 100 is referred to as a cascode device. In some examples, the semiconductor power device 100 is referred to as a high voltage cascode device.

When a voltage is applied across the series combination, the voltage is divided between the first power transistor 108 and the second power transistor 110, which may allow the cascode device to handle higher voltages than each transistor could support individually. Similarly, when a cascode device is designed for a specific voltage rating, the series combination of two high voltage devices may allow a lower total resistance (e.g. the sum of on-state resistances of two transistors) as compared to the resistance of a single transistor having the same/similar active area (e.g., if designed for the same rated voltage). This may allow the high voltage cascode device to handle higher currents as compared to a single unipolar power switch. In some examples, the semiconductor power device 100 includes a cascode connection of two or more semiconductor power devices to construct a high-voltage device having a breakdown voltage of $BV=BV_{Device1}+BV_{Device2}$ and an on-resistance of $Ron=Ron_{Device1}+Ron_{Device2}$.

The first power transistor 108 may be referred to as an upper device because, in some examples, the first power transistor 108 is located closer to the output voltage source. The second power transistor 110 may be referred to as a lower device because, in some examples, the second power transistor 110 is located closer to the input. In some examples, the first power transistor 108 is a higher voltage device than the second power transistor 110. In some examples, the first power transistor 108 has a breakdown voltage that is higher than the breakdown voltage of the second power transistor 110.

In some examples, the first power transistor 108 includes a junction field-effect transistor (JFET). In some examples, the first power transistor 108 includes a metal-oxide-semiconductor field-effect transistor (MOSFET). In some examples, the first power transistor 108 includes a bipolar junction transistor (BJT). In some examples, the first power transistor 108 includes a high-voltage (HV) silicon carbide (SiC) JFET. In some examples, the first power transistor is configured as a normally-on device, where the first power transistor 108 conducts current when the gate-to-source voltage is zero or substantially zero. In some examples, the second power transistor 110 includes a MOSFET. In some examples, the second power transistor 110 includes a HV SiC MOSFET. In some examples, the second power transistor 110 includes a JFET. In some examples, the second power transistor 110 includes a BJT. In some examples, the second power transistor 110 is configured as a normally-off device, where the second power transistor 110 does not conduct current when the gate-to-source voltage is zero or substantially zero. In some examples, the first power transistor 108 and the second power transistor 110 are power transistors of different types (one is a MOSFET, and the other is a JFET or BJT). In some examples, the first power transistor 108 and the second power transistor 110 are transistors of the same type. In some examples, a transistor (e.g., the first power transistor 108 or the second power transistor 110) is a BJT with terminals referred to as a base, an emitter and a collector. As discussed herein, the terms gate terminal, source terminal, and drain terminal may encompass and/or be replaced with base (or base terminal), emitter (or emitter terminal), and collector (or collector terminal), respectively.

The first power transistor 108 includes a drain terminal 101, a source terminal 103, and a gate terminal 105. The second power transistor 110 includes a drain terminal 107, a source terminal 109, and a gate terminal 111. In some examples, the second power transistor 110 includes a diode 116 (e.g. internal body diode) connected to the drain terminal 107 of the second power transistor 110 and the source terminal 109 of the second power transistor 110. In some examples, the drain terminal 101 of the first power transistor 108 serves as a drain terminal of the cascode device. The source terminal 103 of the first power transistor 108 is connected to the drain terminal 107 of the second power transistor 110. In some examples, the source terminal 109 of the second power transistor 110 serves as a source terminal of the cascode device. In some examples, the gate terminal 111 of the second power transistor 110 serves as a gate terminal of the cascode device.

The gate terminal 105 of the first power transistor 108 is coupled (e.g., indirectly coupled) to the source terminal 109 of the second power transistor 110 via a voltage divider circuit 120. In other words, the gate terminal 105 of the first power transistor 108 is not directly connected to the source terminal 109 of the second power transistor 110. Rather, the voltage divider circuit 120 indirectly connects the gate terminal 105 of the first power transistor 108 to the source terminal 109 of the second power transistor 110. The gate terminal 105 of the first power transistor 108 is connected to the voltage divider circuit 120. The source terminal 109 of the second power transistor 110 is connected to the voltage divider circuit 120.

The voltage divider circuit 120 includes a first circuit element 112 (D1) and a second circuit element 114 (D2). The first circuit element 112 may connect the source terminal 103 of the first power transistor 108 and the gate terminal 105 of the first power transistor 108. A first terminal 113 of the first circuit element 112 is connected to the source terminal 103 of the first power transistor 108. The first terminal 113 of the first circuit element 112 is connected to the drain terminal 107 of the second power transistor 110. A second terminal 115 of the first circuit element 112 is connected to the gate terminal 105 of the first power transistor 108. The second terminal 115 of the first circuit element 112 is connected to a first terminal 117 of the second circuit element 114. The first terminal 117 of the second circuit element 114 is connected to the gate terminal 105 of the first power transistor 108. A second terminal 119 of the second circuit element 114 is connected to the source terminal 109 of the second power transistor 110.

In some examples, the first circuit element 112 is a voltage clamping (e.g. voltage limiting) element. In some examples, the first circuit element 112 is a diode. In some examples, the first circuit element 112 is a Zenner diode. In some examples, the first circuit element 112 is a p-n diode. In some examples, the first circuit element 112 is a Schottky diode. In some examples, the first circuit element 112 includes two or more diodes. In some examples, the first circuit element 112 includes two or more diodes connected in series. In some examples, the first circuit element 112 is configured to cause the gate-source voltage ($V_{gs\_upper}$) of the first power transistor 108 to be less (e.g., always less) than a maximum gate-source voltage ($V_{gs\_upper\_max}$) (e.g., a gate-source breakdown voltage).

In some examples, the second circuit element 114 is a capacitor. In some examples, the second circuit element 114 includes two or more capacitors. In some examples, the second circuit element 114 includes a capacitor and a resistor. In some examples, the resistor and the capacitor are connected in parallel. In some examples, the second circuit element 114 includes one or more capacitors and/or one or more resistors. In some examples, the gate-source voltage ($V_{gs\_upper}$) of the first power transistor 108 is independent of the drain-source voltage ($V_{ds\_lower}$) of the second power transistor 110. As a result, the second power transistor 110 may be a high voltage device. In some examples, the voltage rating of the semiconductor power device 100 is the sum of the voltage rating of the first power transistor 108 and the voltage rating of the second power transistor 110.

In some examples, the first circuit element 112 is integrated into the upper device. For example, the semiconductor power device 100 includes a semiconductor package 102 with a first semiconductor device 104 and a second semiconductor device 106. In some examples, the second semiconductor device 106 is a device that is separate and/or distinct from the first semiconductor device 104. The second semiconductor device 106 may be connected to the first semiconductor device 104. In some examples, the first semiconductor device 104 is referred to as an upper device. In some examples, the first semiconductor device 104 is a semiconductor die (e.g., a portion of semiconductor material wafer) that includes the first power transistor 108. In some examples, the first semiconductor device 104 includes the first circuit element 112. In some examples, the second circuit element 114 is integrated into the lower device. In some examples, the second semiconductor device 106 is referred to as a lower device. In some examples, the second semiconductor device 106 is a semiconductor die (e.g., a silicon wafer) that includes the second power transistor 110. In some examples, the second semiconductor device 106 includes the second circuit element 114.

In response to the gate-source voltage ($V_{gs\_cascode}$) of the semiconductor power device 100 being greater than a threshold voltage ($V_{th\_second\_transistor}$) of the second power transistor 110, the first power transistor 108 and the second power transistor 110 are activated (e.g., turned-on), thereby conducting a current ($I_{d\_cascode}$) through both the first power transistor 108 and the second power transistor 110, where $I_{d\_cascode}=V_{ds\_cascode}/(R_{ds(on)\_second\_transistor}+R_{ds(on)\_first\_transistor}$. $V_{ds\_cascode}$ is the drain-source voltage applied to the cascode device. $R_{ds(on)\_second\_transistor}$ is the on-resistance of the second power transistor 110. $R_{ds(on)\_first\_transistor}$ is the on-resistance of the first power transistor 108.

In response to the gate-source voltage ($V_{gs\_cascode}$) of the semiconductor power device 100 being less than the voltage threshold ($V_{th\_second\_transistor}$) of the second power transistor 110, the second power transistor 110 is deactivated (e.g., turned off), thereby increasing the potential of the drain terminal 107 of the second power transistor 110 and increasing the potential of the source terminal 103 of the first power transistor 108. The increasing potential of the drain terminal 107 and the increasing potential of the source terminal 103 may cause the gate-source voltage of the first power transistor 108 to become negative, effectively deactivating the first power transistor 108, which would share applied voltage as $V_{ds\_cascode}=V_{ds\_first\_transistor}+V_{ds\_second\_transistor}$. $V_{ds\_first\_transistor}$ is the drain-source voltage across the first power transistor 108. $V_{ds\_second\_transistor}$ is the drain-source voltage across the second power transistor 110.

In some examples, the maximum allowed gate-source voltage ($V_{gs\_max\_first\_transistor}$) of the first power transistor 108 is less than (e.g., substantially less than) the drain-source voltage ($V_{ds\_second\_transistor}$) of the second power transistor 110 in the off-state. In some examples, since the maximum allowed gate-source voltage ($V_{gs\_max\_first\_transistor}$) is less than (e.g., substantially less than) than the drain-source voltage ($V_{ds\_second\_transistor}$) in the off-state, the gate-source voltage ($V_{gs\_first\_transistor}$) of the first power transistor 108 is limited by the first circuit element 112 (D1) of the voltage divider circuit 120 to avoid (e.g., prevent) device malfunction (e.g., destruction). The remaining voltage may drop over the second circuit element 114 (D2) of the voltage divider (e.g., D2: $V_{D2}=V_{ds\_second\_transistor}-V_{D1}$).

FIG. 1B illustrates a graph that depicts the specific on-resistance as a function of a breakdown voltage of the unipolar semiconductor (e.g., SiC) power device 100 of FIG. 1A and several single transistor devices according to an aspect. Line 136 depicts an example of a unipolar limit (e.g., SiC unipolar limit). Line 132 depicts an example of the specific on-resistance as a function of the breakdown voltage for the semiconductor power device 100 of FIG. 1A. Line

134 depicts an example of a specific on-resistance as a function of the breakdown voltage for a single JFET device (e.g., SiC JFET). Line 130 depicts an example of a specific on-resistance as a function of the breakdown voltage for a single MOSFET device (e.g., SiC MOSFET). As shown in FIG. 1B, the semiconductor power device 100 of FIG. 1A may achieve a reduction in the amount of on-resistance as compared to single SiC devices having the same maximum voltage rating (e.g. breakdown voltage).

Figure 2A:
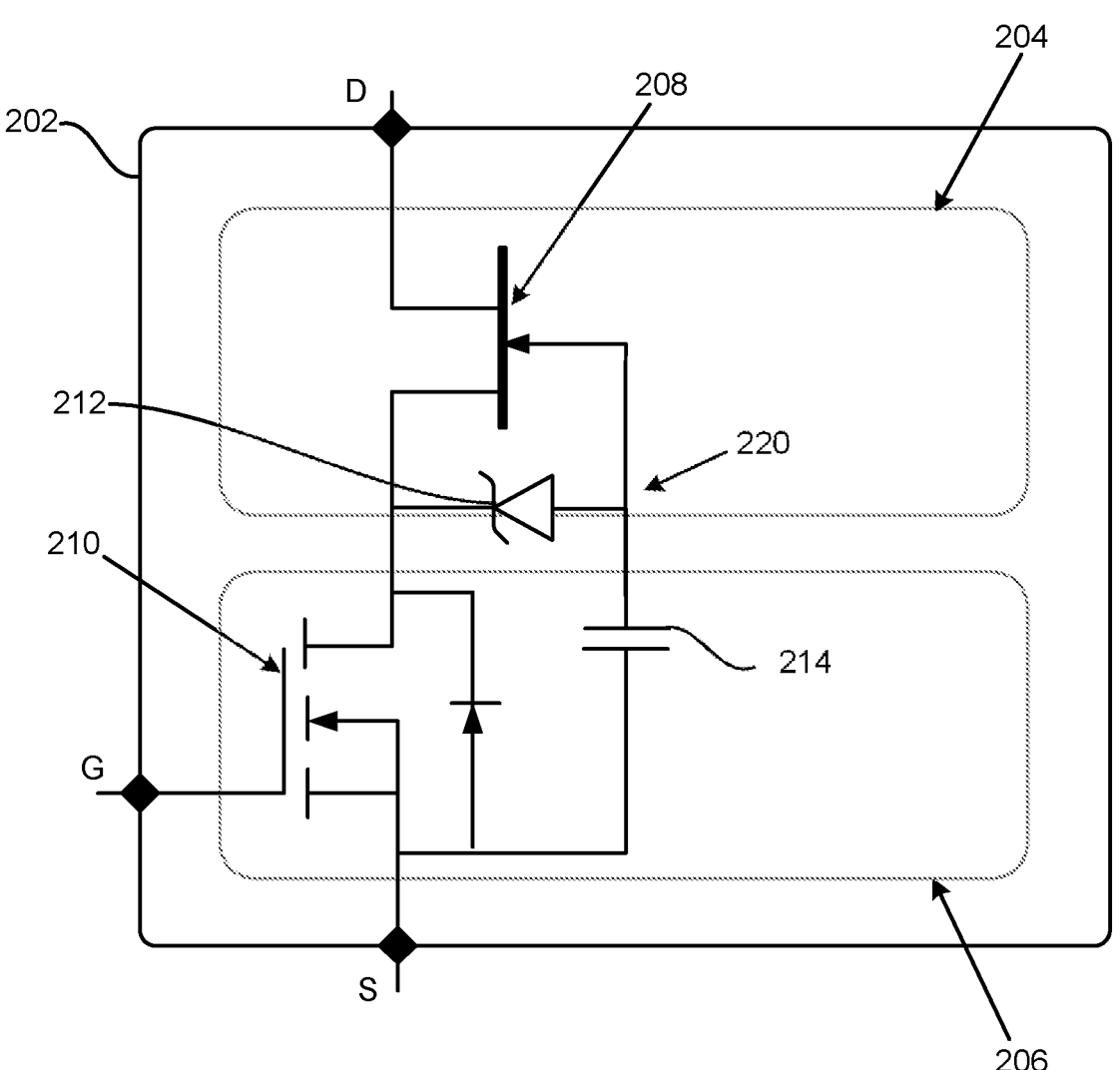
FIG. 2A illustrates a semiconductor power device with a voltage divider and first and second power transistors connected in a cascode configuration according to another aspect.

FIG. 2A illustrates a semiconductor power device 200 according to an aspect. The semiconductor power device 200 may be an example of the semiconductor power device 100 of FIGS. 1A and 1B and may include any of the details discussed herein. The semiconductor power device 200 includes a first power transistor 208 and a second power transistor 210. The first power transistor 208 and the second power transistor 210 are connected in a cascode configuration. A cascode configuration may be a circuit topology in which two or more semiconductor power devices (e.g., the first power transistor 208 and the second power transistor 210) are connected in series to achieve a higher voltage and/or current rating. When a voltage is applied across the series combination, the voltage is divided across each of the first power transistor 208 and the second power transistor 210, which may allow the devices to handle higher voltages than they could handle individually. Similarly, as indicated in FIG. 1B, when cascode device is designed for a specific voltage rating, the series combination of two high voltage devices allows lower total resistance (e.g. the sum of on-state resistances of two transistors) compared to the resistance of the single transistor having same/similar active area, if designed for the same rated voltage. This allows the high voltage cascode device to handle higher currents compared to single unipolar power switches. In some examples, the semiconductor power device 200 includes a cascode connection of two or more semiconductor power devices to construct a high-voltage device having a breakdown voltage of $BV=BV_{Device1}+BV_{Device2}$ and an on-resistance of $Ron=Ron_{Device1}+Ron_{Device2}$.

As shown in FIG. 2A, the gate terminal of the first power transistor 208 is coupled (e.g., indirectly coupled) to the source terminal of the second power transistor 210 via a voltage divider circuit 220. In other words, the gate terminal of the first power transistor 208 is not directly connected to the source terminal of the second power transistor 210. Rather, the voltage divider circuit 220 indirectly connects the gate terminal of the first power transistor 208 to the source terminal of the second power transistor 210. The gate terminal of the first power transistor 208 is connected to the voltage divider circuit 220. The source terminal of the second power transistor 210 is connected to the voltage divider circuit 220.

As shown in FIG. 2A, the voltage divider circuit 220 includes a diode 212 and a capacitor 214. The diode 212 may be an example of the first circuit element 112 of FIG. 1A. The capacitor 214 may be an example of the second circuit element 114 of FIG. 1A. The diode 212 may be connected to the source terminal of the first power transistor 208 and the gate terminal of the first power transistor 208. A first terminal of the diode 212 is connected to the source terminal of the first power transistor 208. The first terminal of the diode 212 (e.g. cathode) is connected to the drain terminal of the second power transistor 210. A second terminal of the diode 212 (e.g. anode) is connected to the gate terminal of the first power transistor 208. The second terminal of the diode 212 is connected to a first terminal of the capacitor 214. The first terminal of the capacitor 214 is connected to the gate terminal of the first power transistor 208. A second terminal of the capacitor 214 is connected to the source terminal of the second power transistor 210.

In some examples, the diode 212 is a voltage clamping element. In some examples, the diode 212 is a Zener diode. In some examples, the diode 212 is a Zener diode having a breakdown voltage that is less than the maximum gate-source voltage (e.g. gate-source breakdown voltage) of the first power transistor 208. In some examples, the gate-source voltage of the first power transistor 208 is clamped (e.g. limited) by the breakdown voltage of the diode 212.

In some examples, the diode 212 is integrated into the upper device. For example, the semiconductor power device 200 includes a semiconductor package 202 with a first semiconductor device 204 and a second semiconductor device 206. In some examples, the second semiconductor device 206 is a device that is separate and/or distinct from the first semiconductor device 204. The second semiconductor device 206 may be connected to the first semiconductor device 204. In some examples, the first semiconductor device 204 is referred to as an upper device. In some examples, the first semiconductor device 204 is a semiconductor die (e.g., a portion of semiconductor material wafer) that includes the first power transistor 208. In some examples, the first semiconductor device 204 includes the diode 212. In some examples, the capacitor 214 is integrated into the lower device. In some examples, the second semiconductor device 206 is referred to as a lower device. In some examples, the second semiconductor device 206 is a semiconductor die (e.g., a silicon wafer) that includes the second power transistor 210. In some examples, the second semiconductor device 206 includes the capacitor 214. In some embodiments the diode 212 and capacitor 214 are integrated into one of the power devices (e.g. into the first power transistor 208 or the second power transistor 210). In some embodiments the diodes 212 and capacitor 214 can be standalone elements interconnected with power transistors 208 and 210 inside the package.

Figures 2B, 2C:
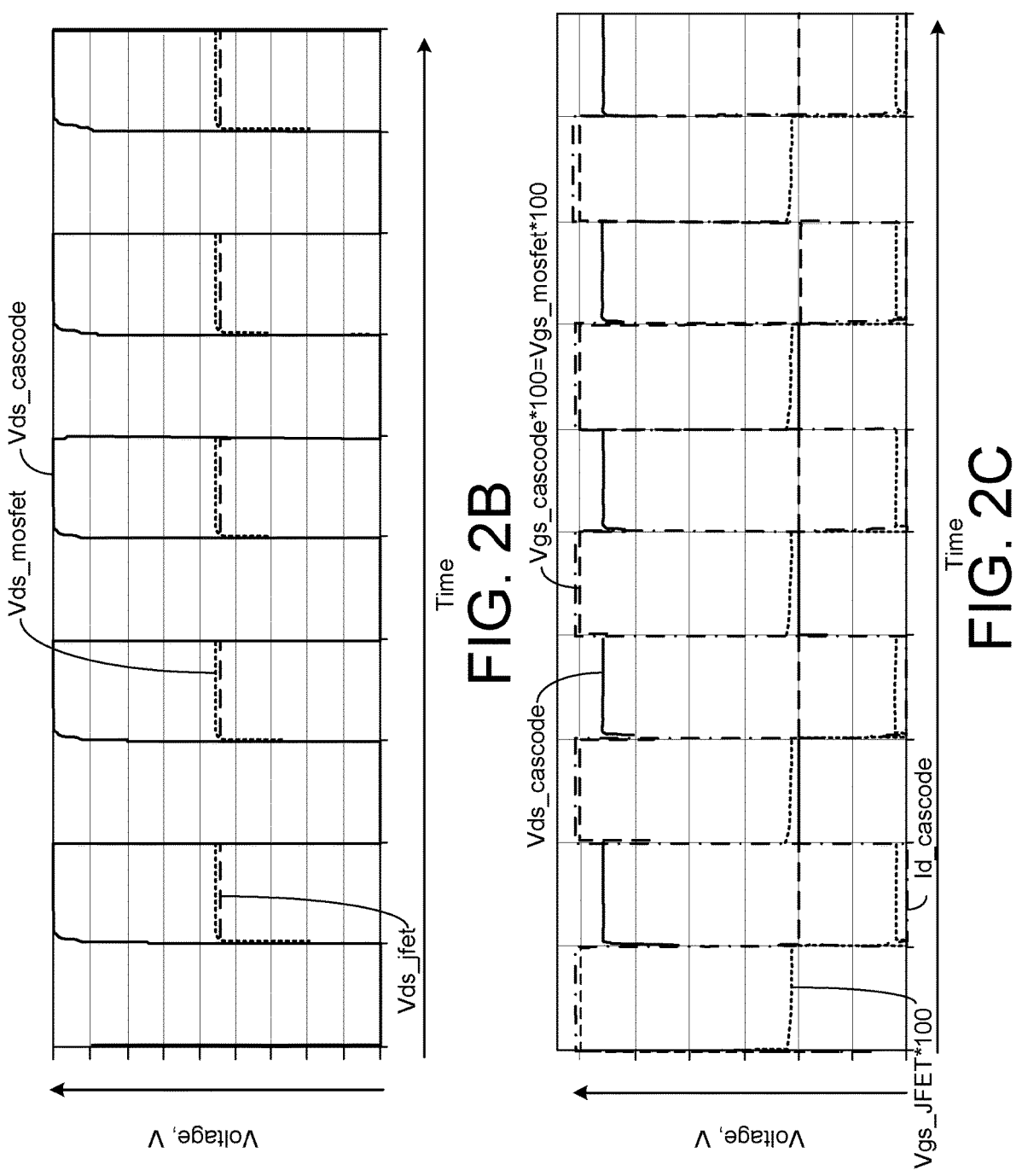
FIGS. 2B and 2C illustrate voltage and current waveforms of a semiconductor power device with first and second power transistors according to an aspect.

FIGS. 2B and 2C illustrate example waveforms of the semiconductor power device 200, including the first power transistor 208 and the second power transistor 210. As shown in FIGS. 2B and 2C, the first power transistor 208 and the second power transistor 210 may operate below their maximum rated voltages efficiently sharing total cascode device voltage between each other.

Figure 3A:
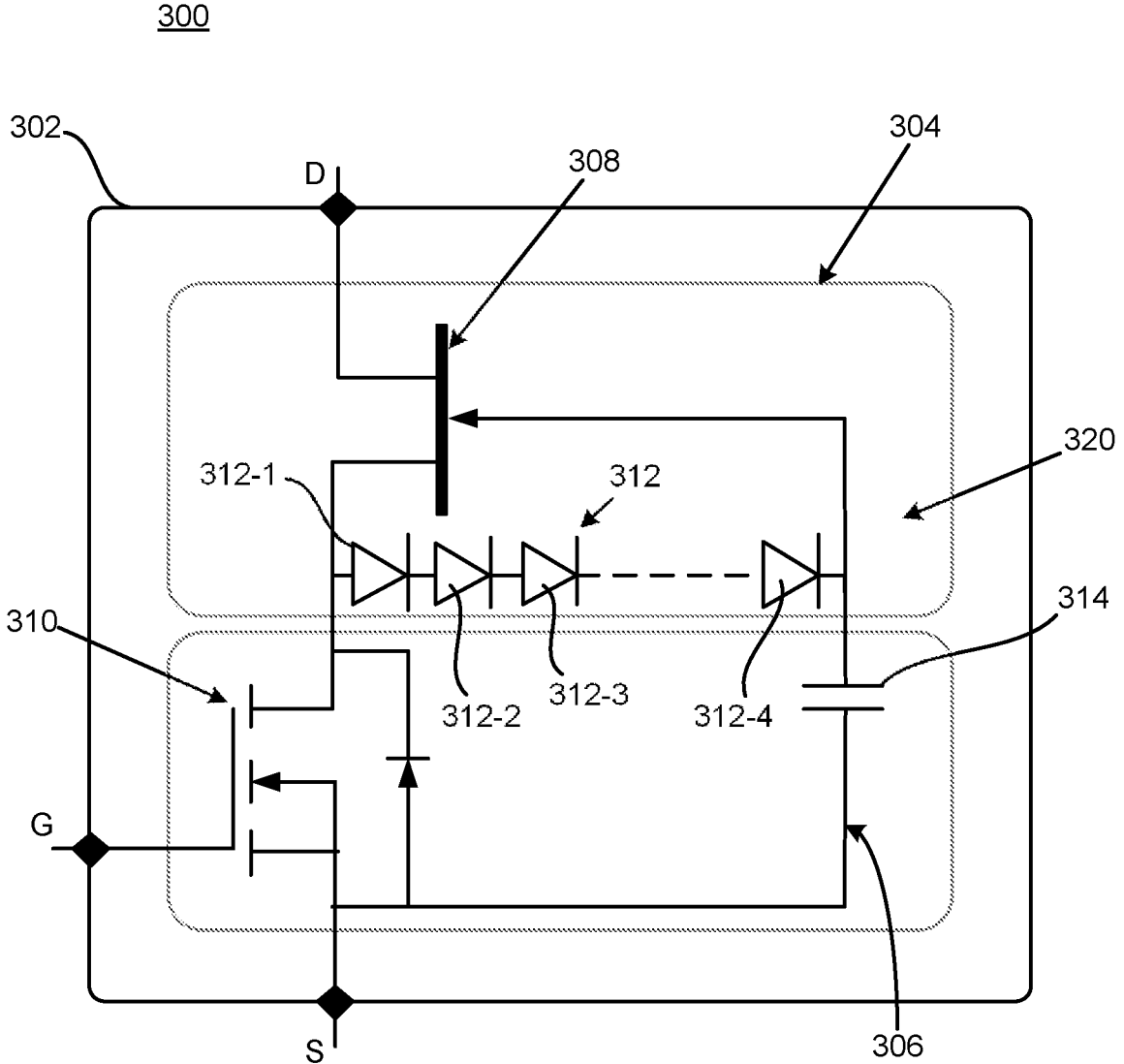
FIG. 3A illustrates a semiconductor power device with a voltage divider and first and second power transistors connected in a cascode configuration according to another aspect.

FIG. 3A illustrates a semiconductor power device 300 according to an aspect. The semiconductor power device 300 may be an example of the semiconductor power device 100 of FIGS. 1A and 1B and may include any of the details discussed herein. The semiconductor power device 300 includes a first power transistor 308 and a second power transistor 310. The first power transistor 308 and the second power transistor 310 are connected in a cascode configuration. A cascode configuration may be a circuit topology in which two or more power semiconductor devices (e.g., the first power transistor 308 and the second power transistor 310) are connected in series to achieve a higher voltage and/or current rating. When a voltage is applied across the series combination, the voltage is divided across each of the first power transistor 308 and the second power transistor 310, which may allow the devices to handle higher voltages than they could handle individually. Similarly, when cascode device is designed for a specific voltage rating, the series combination of two high voltage devices allows lower total resistance (e.g. the sum of on-state resistances of two transistors) compared to the resistance of the single transistor having same/similar active area, if designed for the same rated voltage. This allows the high voltage cascode device to handle higher currents compared to single unipolar power switches. In some examples, the semiconductor power device 300 includes a cascode connection of two or more semiconductor devices to construct a high-voltage device having a breakdown voltage of $BV=BV_{Device1}+BV_{Device2}$ and an on-resistance of $Ron=Ron_{Device1}+Ron_{Device2}$.

As shown in FIG. 3A, the gate terminal of the first power transistor 308 is coupled (e.g., indirectly coupled) to the source terminal of the second power transistor 310 via a voltage divider circuit 320. In other words, the gate terminal of the first power transistor 308 is not directly connected to the source terminal of the second power transistor 310. Rather, the voltage divider circuit 320 indirectly connects the gate terminal of the first power transistor 308 to the source terminal of the second power transistor 310. The gate terminal of the first power transistor 308 is connected to the voltage divider circuit 320. The source terminal of the second power transistor 310 is connected to the voltage divider circuit 320.

As shown in FIG. 3A, the voltage divider circuit 320 includes a plurality of diodes 312 (e.g., a sequence or a chain of diodes 312) and a capacitor 314. The diodes 312 may be an example of the first circuit element 112 of FIG. 1A. In some examples, the voltage divider circuit 320 includes two or more diodes 312 connected in series with each other. In some examples, the diodes 312 includes p-n diodes. In some examples, the diodes 312 include Schottky diodes. The diodes 312 may include a diode 312-1, a diode 312-2, a diode 312-3, and a diode 312-4. However, it is noted that the number of diodes 312 may be two, three, or any number greater than four. In some examples, the diodes 312 may be configured such as $$n \times V_f < V_{gs\_max\_transistor,\,first},$$

where n is the number of diodes in the chain and Vf is the forward voltage drop (e.g. turn-on voltage) of a single diode. In some examples, the clamping voltage is defined by the sum of the turn-on voltages of the diodes 312.

In some examples, the diodes 312 are integrated into the upper device. For example, the semiconductor power device 300 includes a semiconductor package 302 with a first semiconductor device 304 and a second semiconductor device 306. In some examples, the second semiconductor device 306 is a device that is separate and/or distinct from the first semiconductor device 304. The second semiconductor device 306 may be connected to the first semiconductor device 304. In some examples, the first semiconductor device 304 is referred to as an upper device. In some examples, the first semiconductor device 304 is a semiconductor die (e.g., a silicon wafer) that includes the first power transistor 308. In some examples, the first semiconductor device 304 includes the diodes 312. In some examples, the capacitor 314 is integrated into the lower device. In some examples, the second semiconductor device 306 is referred to as a lower device. In some examples, the second semiconductor device 306 is a semiconductor die (e.g., a portion of semiconductor material wafer) that includes the second power transistor 310. In some examples, the second semiconductor device 306 includes the capacitor 314. In some examples, the diodes 312 and capacitor 314 may be integrated into one of the power devices (e.g. into the first power transistor 308 or the second power transistor 310). In some embodiments the diodes 312 and capacitor 314 can be standalone elements interconnected with power transistors 308 and 310 inside the package.

Figures 3B, 3C:
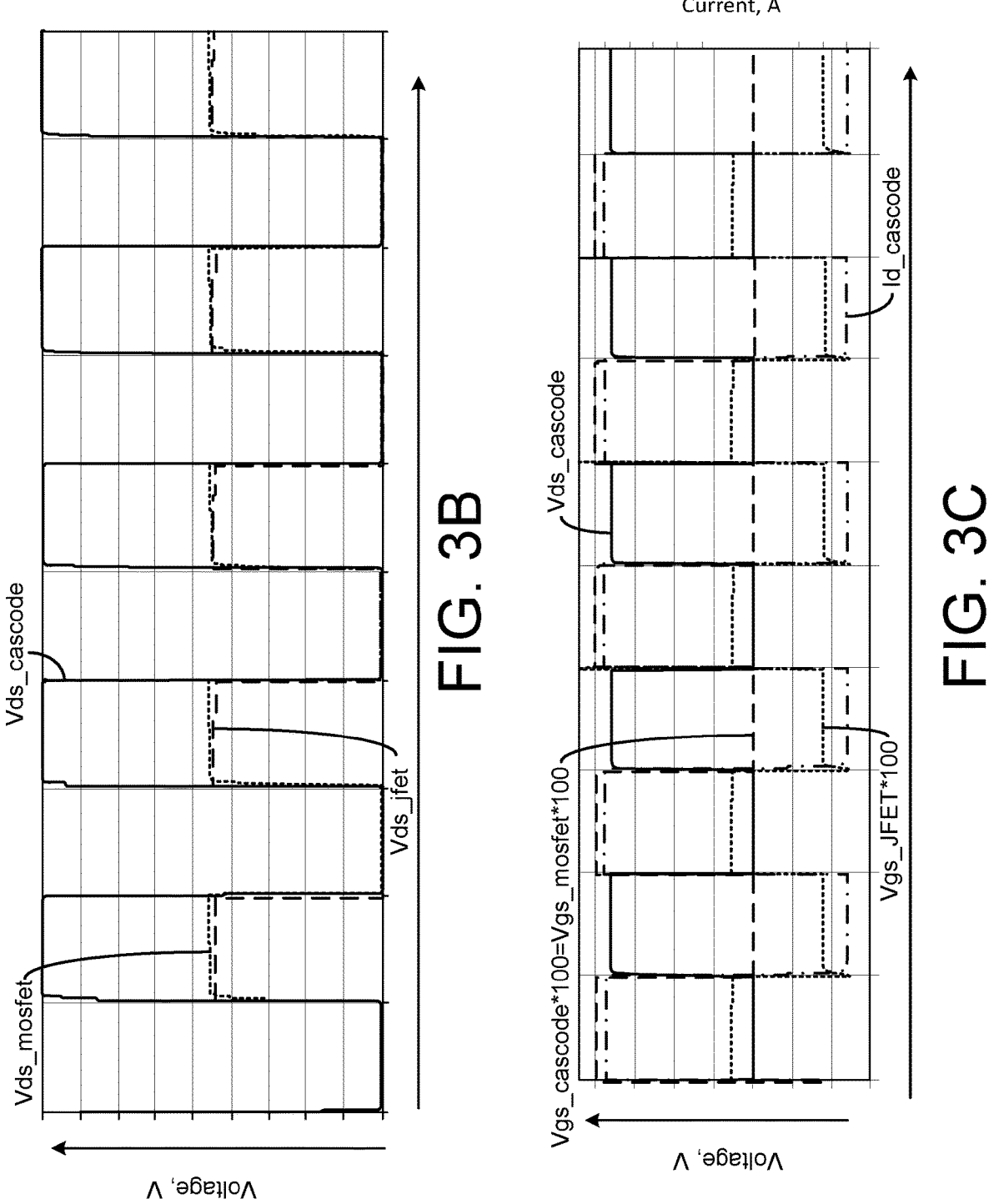
FIGS. 3B and 3C illustrate voltage and current waveforms of a semiconductor power device and first and second power transistors according to an aspect.

FIGS. 3B and 3C illustrate example waveforms of the semiconductor power device 300, including the first power transistor 308 and the second power transistor 310. As shown in FIGS. 3B and 3C, the first power transistor 308 and the second power transistor 310 may operate below their maximum rated voltages efficiently sharing total cascode device voltage between each other.

Figure 4A:
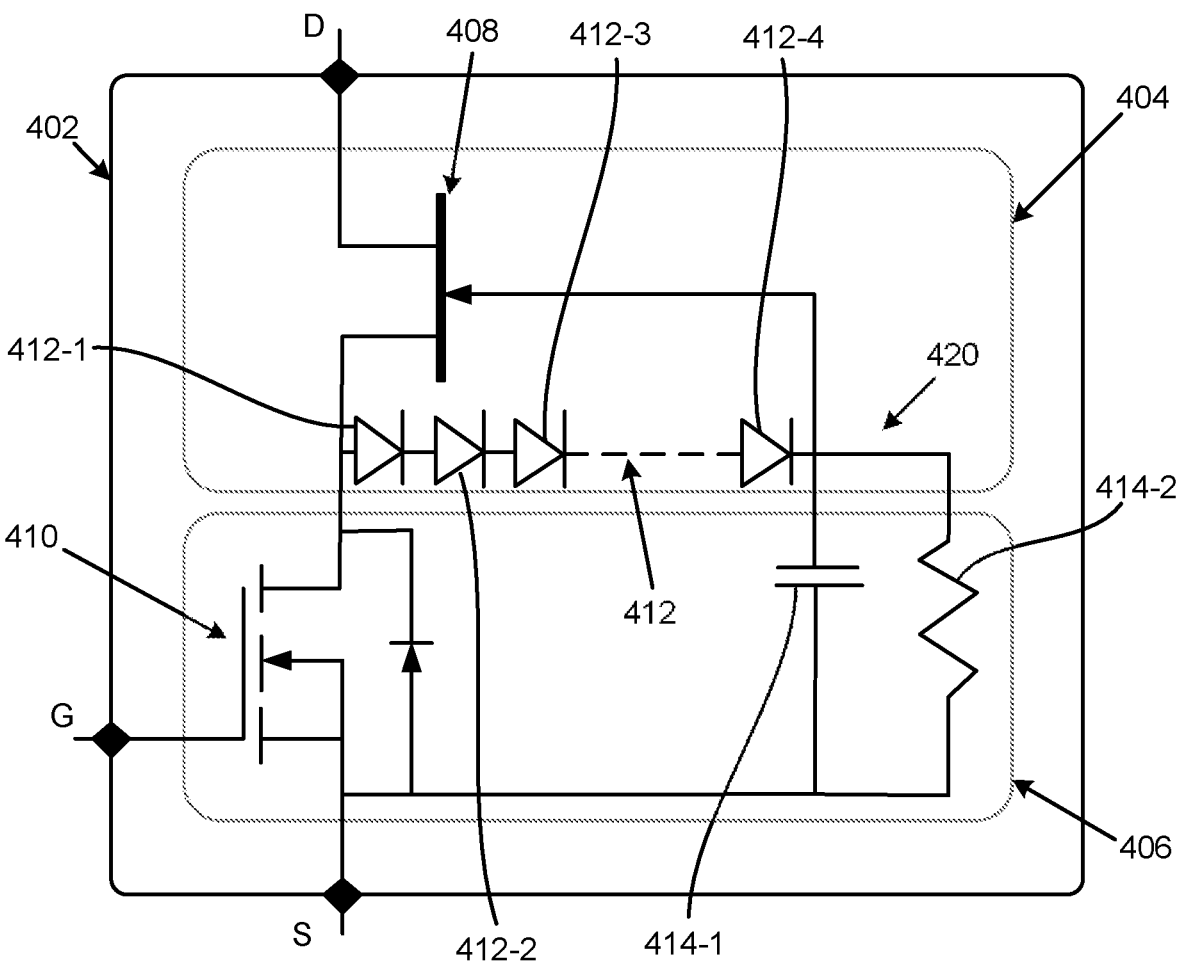
FIG. 4A illustrates a semiconductor power device with a voltage divider and first and second power transistors connected in a cascode configuration according to another aspect.

FIG. 4A illustrates a semiconductor power device 400 according to an aspect. The semiconductor power device 400 may be an example of the semiconductor power device 100 of FIGS. 1A and 1B and may include any of the details discussed herein. The semiconductor power device 400 includes a first power transistor 408 and a second power transistor 410. The first power transistor 408 and the second power transistor 410 are connected in a cascode configuration. A cascode configuration may be a circuit topology in which two or more power semiconductor devices (e.g., the first power transistor 408 and the second power transistor 410) are connected in series to achieve a higher voltage and/or current rating. When a voltage is applied across the series combination, the voltage is divided across each of the first power transistor 408 and the second power transistor 410, which may allow the devices to handle higher voltages than they could individually. Similarly, when cascode device is designed for a specific voltage rating, the series combination of two high voltage devices allows lower total resistance (e.g. the sum of on-state resistances of two transistors) compared to the resistance of the single transistor having same/similar active area, if designed for the same rated voltage. This allows the high voltage cascode device to handle higher currents compared to single unipolar power switches. In some examples, the semiconductor power device 400 includes a cascode connection of two or more semiconductor devices to construct a high-voltage device having a breakdown voltage of $BV=BV_{Device1}+BV_{Device2}$ and an on-resistance of $Ron=Ron_{Device1}+Ron_{Device2}$.

As shown in FIG. 4A, the gate terminal of the first power transistor 408 is coupled (e.g., indirectly coupled) to the source terminal of the second power transistor 410 via a voltage divider circuit 420. In other words, the gate terminal of the first power transistor 408 is not directly connected to the source terminal of the second power transistor 410. Rather, the voltage divider circuit 420 indirectly connects the gate terminal of the first power transistor 408 to the source terminal of the second power transistor 410. The gate terminal of the first power transistor 408 is connected to the voltage divider circuit 420. The source terminal of the second power transistor 410 is connected to the voltage divider circuit 420.

As shown in FIG. 4A, the voltage divider circuit 420 includes a plurality of diodes 412 (e.g., a sequence or a chain of diodes 412), a capacitor 414-1, and a resistor 414-2. The diodes 412 may be an example of the first circuit element 112 of FIG. 1A. In some examples, the voltage divider circuit 420 includes two or more diodes 412 connected in series with each other. In some examples, the diodes 412 includes p-n diodes. In some examples, the diodes 412 include Schottky diodes. The diodes 412 may include a diode 412-1, a diode 412-2, a diode 412-3, and a diode 412-4. However, it is noted that the number of diodes 412 may be two, three, or any number greater than four. In some examples, the diodes 412 may be configured such as $$n \times V_f < V_{gs\_max\_transistor,\ first},$$

where n is the number of diodes 412 in the chain. In some examples, the clamping voltage is defined by the sum of the turn-on voltages of the diodes 412. The capacitor 414-1 and the resistor 414-2 may be an example of the second circuit element 114 of FIG. 1A. In some examples, the resistor 414-2 is connected in parallel with the capacitor 414-1. In some examples, the combination of the resistor 414-2 and the capacitor 414-1 may provide better voltage sharing across devices at lower frequencies.

In some examples, the diodes 412 are integrated into the upper device. For example, the semiconductor power device 400 includes a semiconductor package 402 with a first semiconductor device 404 and a second semiconductor device 406. In some examples, the second semiconductor device 406 is a device that is separate and/or distinct from the first semiconductor device 404. The second semiconductor device 406 may be connected to the first semiconductor device 404. In some examples, the first semiconductor device 404 is referred to as an upper device. In some examples, the first semiconductor device 404 is a semiconductor die (e.g., a portion of semiconductor material wafer) that includes the first power transistor 408. In some examples, the first semiconductor device 404 includes the diodes 412. In some examples, the capacitor 414-1 and the resistor 414-2 are integrated into the lower device. In some examples, the second semiconductor device 406 is referred to as a lower device. In some examples, the second semiconductor device 406 is a semiconductor die (e.g., a silicon wafer) that includes the second power transistor 410. In some examples, the second semiconductor device 406 includes the capacitor 414-1 and the resistor 414-2. In some examples, the diodes 412, the capacitor 414-1, and/or the resistor 414-2 can be integrated into one of the power devices (e.g., a semiconductor device with the first power transistor 408 or a semiconductor device with the second power transistor 410). In some examples, one or more of the diodes 412, the capacitor 414-1, and/or the resistor 414-2 may be integrated into a semiconductor device with the first power transistor 408 and one or more of the diodes 412, the capacitor 414-1, and/or the resistor 414-2 may be integrated into a semiconductor device with the second power transistor 410.

Figures 4B, 4C:
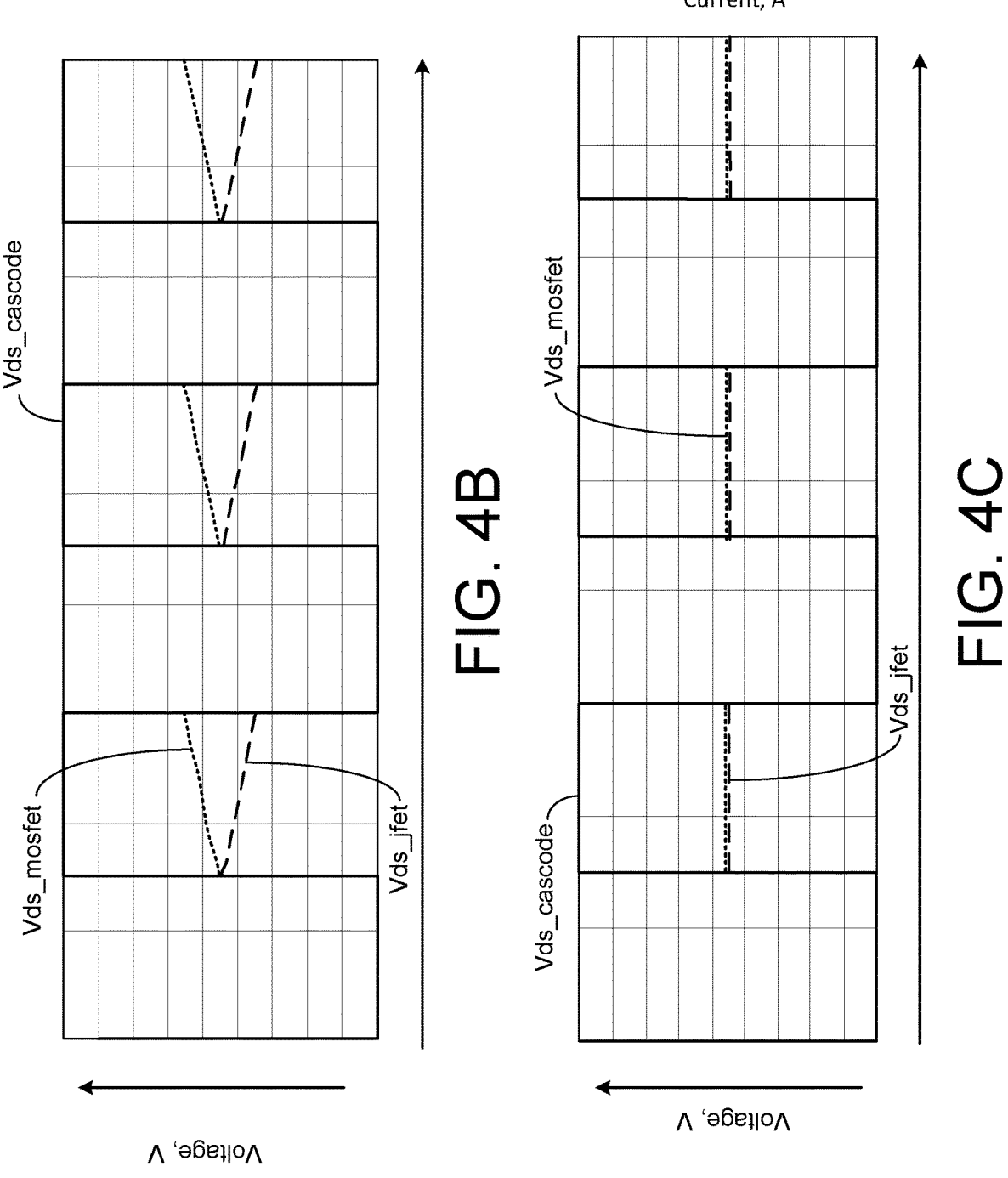
FIGS. 4B and 4C illustrate voltage waveforms of a semiconductor power device and first and second power transistors according to an aspect.

FIGS. 4B and 4C illustrate example waveforms of the semiconductor power device 400, including the first power transistor 408 and the second power transistor 410. FIG. 4B illustrates example waveforms without the resistor 414-2. FIG. 4C illustrates example waveforms with the resistor 414-2. As shown in FIGS. 4B and 4C, the first power transistor 408 and the second power transistor 410 may operate below their maximum rated voltages, efficiently sharing total cascode device voltage between each other.

Figure 5:
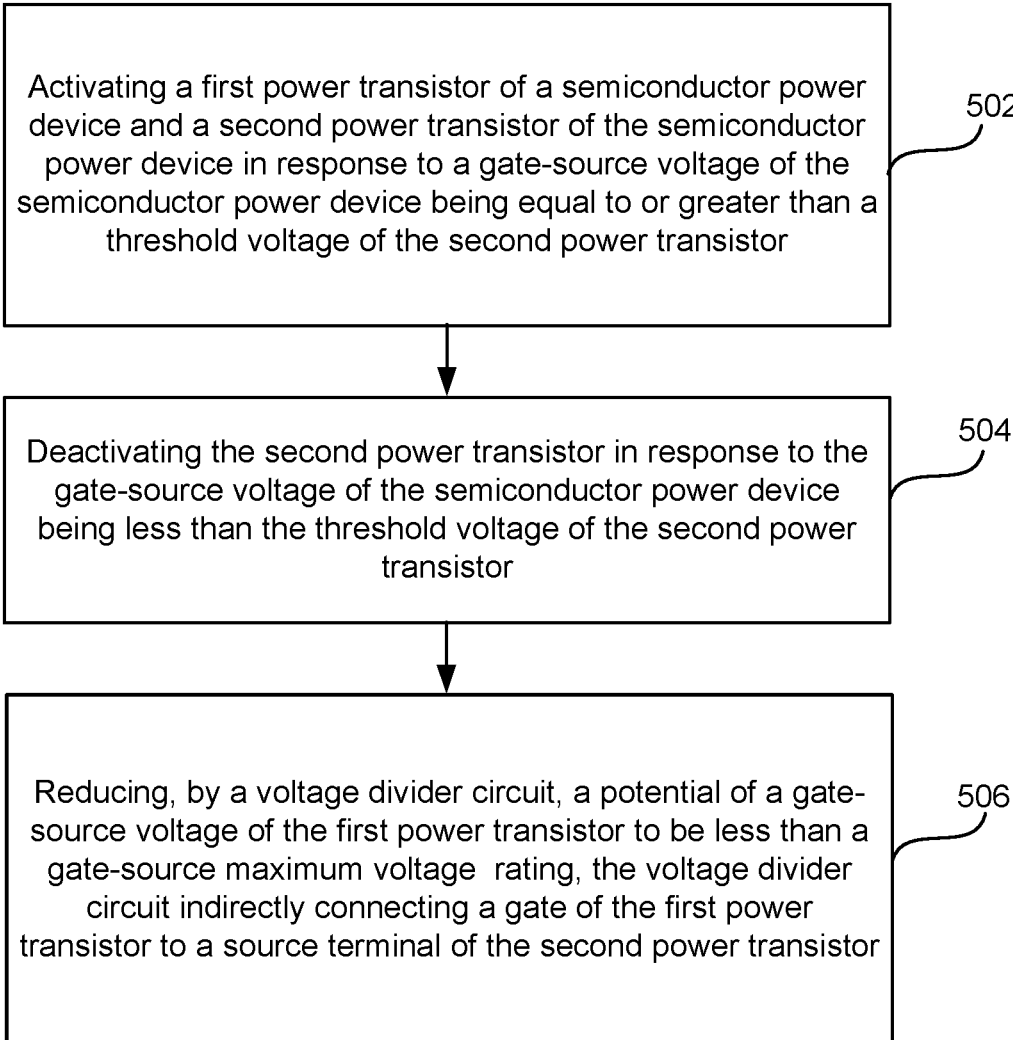
FIG. 5 illustrates a flowchart depicting example operations of a semiconductor power device according to an aspect.

FIG. 5 depicts a flowchart 500 depicting a method with example operations of a semiconductor power device according to an aspect. Although the flowchart 500 is described with reference to the semiconductor power device 100 of FIGS. 1A and 1B, the flowchart may be applicable to any of the semiconductor power devices discussed herein. Although the flowchart 500 of FIG. 5 illustrates operations in sequential order, it will be appreciated that this is merely an example, and that additional or alternative operations may be included. Further, operations of FIG. 5 and related operations may be executed in a different order than that shown, or in a parallel or overlapping fashion.

Operation 502 includes activating a first power transistor of a semiconductor power device and a second power transistor of the semiconductor power device in response to a gate-source voltage of the semiconductor power device being equal to or greater than a threshold voltage of the second power transistor.

Operation 504 includes deactivating the second power transistor in response to the gate-source voltage of the semiconductor power device being less than the threshold voltage of the second power transistor.

Operation 506 includes reducing, by a voltage divider circuit, gate-source voltage of the first power transistor to be less than a gate-source voltage maximum rating (e.g., gate-source breakdown voltage), the voltage divider circuit indirectly connecting a gate of the first power transistor to a source terminal of the second power transistor.

Clause 1. A semiconductor power device comprising: a first power transistor configured to generate an output voltage; a second power transistor configured to receive an input voltage, the second power transistor connected to the first power transistor in a cascode configuration; and a voltage divider circuit connected to a gate terminal of the first power transistor and a source terminal of the second power transistor.

Clause 2. The semiconductor power device of clause 1, wherein the voltage divider circuit includes at least one first circuit element and at least one second circuit element.

Clause 3. The semiconductor power device of clause 2, wherein the at least one first circuit element includes a diode.

Clause 4. The semiconductor power device of clause 2, wherein the at least one first circuit element includes two or more diodes connected in series.

Clause 5. The semiconductor power device of clause 2, wherein the at least one second circuit element includes a capacitor.

Clause 6. The semiconductor power device of clause 2, wherein the at least one second circuit element includes a capacitor and a resistor.

Clause 7. The semiconductor power device of clause 2, further comprising: a semiconductor package, including: a first semiconductor device that includes the first power transistor; and a second semiconductor device that includes the second power transistor, wherein the first semiconductor device includes the at least one first circuit element and the second semiconductor device includes the at least one second circuit element.

Clause 8. The semiconductor power device of clause 1, wherein the first power transistor is a normally-on device, and the second power transistor is a normally-off device.

Clause 9. A semiconductor power device comprising: a first power transistor configured to generate an output voltage; a second power transistor configured to receive an input voltage, the second power transistor connected to the first power transistor in a cascode configuration; and a voltage divider circuit configured to indirectly couple a gate terminal of the first power transistor to a source terminal of the second power transistor, the voltage divider circuit including at least one first circuit element and at least one second circuit element.

Clause 10. The semiconductor power device of clause 9, wherein the at least one first circuit element is configured to cause a gate-source voltage of the first power transistor to be less than a gate-source maximum voltage rating.

Clause 11. The semiconductor power device of clause 9, wherein the at least one first circuit element includes a diode.

Clause 12. The semiconductor power device of clause 9, wherein the at least one first circuit element includes two or more diodes connected in series.

Clause 13. The semiconductor power device of clause 9, wherein the at least one second circuit element includes at least one of a capacitor or a resistor.

Clause 14. The semiconductor power device of clause 13, wherein the resistor is connected in parallel with the capacitor.

Clause 15. The semiconductor power device of clause 9, further comprising: a semiconductor package, including: a first semiconductor device that includes the first power transistor; and a second semiconductor device that includes the second power transistor, wherein the first semiconductor device includes the at least one first circuit element and the second semiconductor device includes the at least one second circuit element.

Clause 16. The semiconductor power device of clause 9, further comprising: a semiconductor package, including: a first semiconductor device that includes the first power transistor; and a second semiconductor device that includes the second power transistor, wherein the first semiconductor device includes the at least one first circuit element and the at least one second circuit element.

Clause 17. The semiconductor power device of clause 9, further comprising: a semiconductor package, including: a first semiconductor device that includes the first power transistor; and a second semiconductor device that includes the second power transistor, wherein the second semiconductor device includes the at least one first circuit element and the at least one second circuit element.

Clause 18. A method comprising: activating a first power transistor of a semiconductor power device and a second power transistor of the semiconductor power device in response to a gate-source voltage of the semiconductor power device being equal to or greater than a threshold voltage of the second power transistor; deactivating the second power transistor in response to the gate-source voltage of the semiconductor power device being less than the threshold voltage of the second power transistor; and reducing, by a voltage divider circuit, a potential of a gate-source voltage of the first power transistor to be less than a gate-source maximum voltage rating, the voltage divider circuit indirectly connecting a gate of the first power transistor to a source terminal of the second power transistor.

Clause 19. The method of clause 18, wherein the voltage divider circuit includes at least one first circuit element and at least one second circuit element.

Clause 20. The method of clause 19, wherein the at least one first circuit element includes one or more diodes, and the at least one second circuit element includes at least one of a capacitor or a resistor.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A semiconductor power device comprising:
a first power transistor configured to generate an output voltage;
a second power transistor configured to receive an input voltage, the second power transistor connected to the first power transistor in a cascode configuration; and
a voltage divider circuit connected to a gate terminal of the first power transistor and a source terminal of the second power transistor, the voltage divider circuit configured to limit a gate-source voltage of the first power transistor to be less than a gate-source threshold level of the first power transistor, regardless of a magnitude of a drain-source voltage of the second power transistor.

2. The semiconductor power device of claim 1, wherein the voltage divider circuit includes a clamping element and a capacitor, the clamping element being connected to the gate terminal of the first power transistor and a node, and the capacitor being connected to the node and the source terminal of the second power transistor.

3. The semiconductor power device of claim 2, wherein the clamping element is a Zener diode.

4. The semiconductor power device of claim 2, wherein the clamping element is a first clamping element, the voltage divider circuit including a second clamping element connected in series with the first clamping element.

5. The semiconductor power device of claim 2, further comprising:

a semiconductor package, including:

a first semiconductor die fabricated with the first power transistor and the clamping element; and a second semiconductor die fabricated with the second power transistor and the capacitor.

6. The semiconductor power device of claim 1, wherein the first power transistor is a normally-on device, and the second power transistor is a normally-off device.

7. A semiconductor power device comprising:

a first power transistor configured to generate an output voltage;

a second power transistor configured to receive an input voltage, the second power transistor connected to the first power transistor in a cascode configuration; and a voltage divider circuit configured to indirectly couple a gate terminal of the first power transistor to a source terminal of the second power transistor, the voltage divider circuit configured to limit a gate-source voltage of the first power transistor to be less than a gate-source threshold level of the first power transistor, regardless of a magnitude of a drain-source voltage of the second power transistor.

8. The semiconductor power device of claim 7, wherein the voltage divider circuit is configured to cause the gate-source voltage of the first power transistor to be independent of the drain-source voltage of the second power transistor such that a variation in the drain-source voltage of the second power transistor does not cause a variation in the gate-source voltage of the first power transistor.

9. The semiconductor power device of claim 7, wherein the voltage divider circuit includes a clamping element and a capacitor, the clamping element being connected to the gate terminal of the first power transistor and a node, the capacitor being connected to the node and the source terminal of the second power transistor.

10. The semiconductor power device of claim 9, wherein the clamping element is a first clamping element, the voltage divider circuit including a second clamping element connected in series with the first clamping element.

11. The semiconductor power device of claim 9, further comprising:

a semiconductor package, including:

a first semiconductor die fabricated with the first power transistor and the clamping element; and a second semiconductor die fabricated with the second power transistor and the capacitor.

12. The semiconductor power device of claim 9, further comprising:

a semiconductor package, including:

a first semiconductor die fabricated with the first power transistor, the clamping element, and the capacitor; and a second semiconductor die fabricated with the second power transistor.

13. The semiconductor power device of claim 9, further comprising:

a semiconductor package, including:

a first semiconductor die fabricated with the first power transistor; and a second semiconductor die fabricated with the second power transistor, the clamping element, and the capacitor.

14. A method comprising:

activating a first power transistor of a semiconductor power device and a second power transistor of the semiconductor power device in response to a gate-source voltage of the semiconductor power device being equal to or greater than a threshold voltage of the second power transistor;

deactivating the second power transistor in response to the gate-source voltage of the semiconductor power device being less than the threshold voltage of the second power transistor; and limiting, by a voltage divider circuit, of a gate-source voltage of the first power transistor to be less than a gate-source threshold level of the first power transistor, regardless of a magnitude of a drain-source voltage of the second power transistor, the voltage divider circuit indirectly connecting a gate terminal of the first power transistor to a source terminal of the second power transistor.

15. The method of claim 14, wherein the voltage divider circuit includes a clamping element and a capacitor, the clamping element being connected to the gate terminal of the first power transistor and a node, and the capacitor being connected to the node and the source terminal of the second power transistor.

16. The method of claim 15, wherein the clamping element is a Zener diode.

* * * * *